United States Patent [19]
Berning

[11] 3,995,226
[45] Nov. 30, 1976

[54] AUDIO AMPLIFIER
[76] Inventor: David W. Berning, 11007 Candlelight Lane, Potomac, Md. 20854
[22] Filed: June 10, 1976
[21] Appl. No.: 694,588

[52] U.S. Cl. .................................. 330/3; 330/121; 330/122; 330/123
[51] Int. Cl.² ............................................. H03F 5/00
[58] Field of Search ................ 330/3, 15, 118, 120, 330/121, 122, 123; 328/198, 225

[56] References Cited
UNITED STATES PATENTS
2,852,675   9/1958   Oliver ............................ 330/121 X
3,325,742   6/1967   Moriyasu ............................ 330/3

*Primary Examiner*—James B. Mullins
*Attorney, Agent, or Firm*—Lane, Aitken, Dunner & Ziems

[57] ABSTRACT

An audio amplifier in which an output stage is coupled by a driver stage to an input stage which includes two antiphased sources of alternating current. The output stage includes two pentode vacuum tubes each having a cathode, a plate and a screen grid located between the cathode and the plate. Each tube has a control grid connected between the cathode and the screen grid and a suppressor grid connected between the screen grid and the plate, with the control grid and the suppressor grid being shunted to their respective cathodes. The driver stage includes a pair of transistors connected in a push-pull configuration with their emitters connected to the screen grids of said tubes to supply a relatively high value of alternating current to the screen grids which function as control grids for their respective tubes.

4 Claims, 1 Drawing Figure

U.S. Patent  Nov. 30, 1976  3,995,226
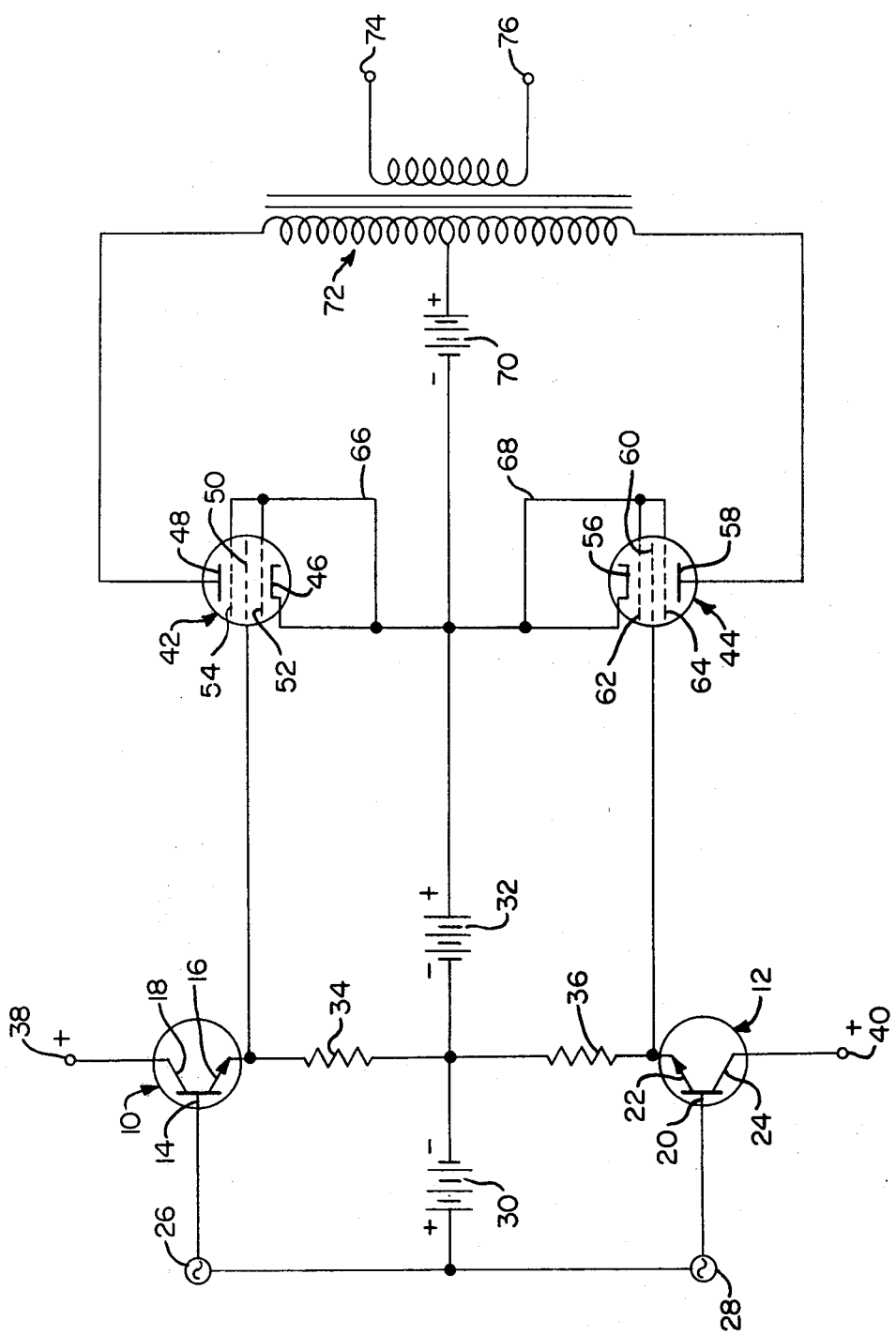

ID_995,226

AUDIO AMPLIFIER

BACKGROUND OF THE INVENTION

This invention relates to an audio amplifier and, more particularly, to an amplifier for amplifying an input signal to a predetermined value in order to sufficiently drive a load such as a loudspeaker.

It is a known technique to provide an audio amplifier having an output stage including two vacuum tubes connected in a push-pull configuration. In these known designs the vacuum tubes are usually in the form of triodes, diodes or pentodes, each of which is subject to one of the chief causes of tube failure, i.e. a control grid-to-cathode short largely caused by the fact that the control grid and the cathode of each tube are spaced relatively close together. Some prior designs, although recognizing the possibility of utilizing another grid as a control grid, suffer from other disadvantages. For example, in the latter designs, the output stage of the amplifier does not provide sufficient current to drive the latter grid in a manner to operate the tube in an efficient, linear manner without the need for feedback or other complicating techniques. Also, these latter designs are subject to reverse current effects caused by secondary electrons emitted by the plates being returned to the cathodes.

Other problems encountered in these types of prior art designs include the inability of the driver stage of the amplifier to supply a constant voltage between the grid functioning as the control grid and the cathode of the tube. Also, in many of these designs the electrode impedances are relatively high thus causing unwanted electron emissions and resultant thermal instabilities. Still further problems encountered with these types of amplifiers are the presence of relatively high idling currents and the requirement for relatively high bias voltges to turn off the tubes, especially when relatively high plate voltages are present.

SUMMARY OF THE INVENTION

It is, therefore, an object of the present invention to provide an audio amplifier which overcomes the above-mentioned problems.

It is also an object of the present invention to provide an audio amplifier in which the output stages of the amplifier include vacuum tubes connected in a manner to minimize the possibility of a grid-to-cathode short.

It is a further object of the present invention to provide an audio amplifier of the above type in which a relatively high voltage can be applied to the plates of the respective tubes.

It is a still further object of the present invention to provide an audio amplifier of the above type which minimizes the possibility of reverse current effects caused by secondary electrons emitted by the plates of the tubes being repelled by the suppressor grids and control grids of the tubes and returned to the plates.

It is a still further object of the present invention to provide an audio amplifier of the above type in which a screen grid is operated as the control grid of the tubes and a relatively high amount of current sufficient to adequately drive the tubes is supplied by the driver stage, without the need for feedback or other complicating techniques.

It is a still further object of the present invention to provide an audio amplifier of the above type in which a constant voltage is maintained between the grid functioning as the control grid of each tube and its respective cathode.

It is a still further object of the present invention to provide an audio amplifier of the above type in which the electrode and grid impedances can be kept relatively low thus eliminating unwanted electron emissions and resultant thermal instabilities.

It is a still further object of the present invention to provide an audio amplifier of the above type in which the idling currents can be kept relatively low to enable the tubes to operate at a relatively low temperature.

It is a still further object of the present invention to provide an audio amplifier of the above type in which relatively small bias voltages can be used to turn off the tubes despite the relatively high plate voltages present.

It is a still further object of the present invention to provide an audio amplifier of the above type which can be designed for linear, highly efficient, operation resulting in relatively high-power output at relatively low distortion while the output tubes are maintained at a relatively low temperature.

Toward the fulfillment of these and other objects, the amplifier of the present invention comprises two transistors each having an emitter electrode, a collector electrode and a base electrode; circuit means for connecting the transistors in a push-pull configuration with their respective base electrodes respectively connected in series with two antiphased signal sources and a direct current bias voltage; two pentode vacuum tubes each having a cathode, a plate, a screen grid located between the cathode and the plate, a control grid located between the cathode and the screen grid and a suppressor grid located between said screen grid and the plate; means for connecting the control grid and the suppressor grid of each tube to their respective cathodes; circuit means for connecting said tubes in a push-pull configuration; circuit means for directly connecting the emitter electrode of one of the transistors to the screen grid of one of the tubes and the emitter electrode of the other transistor to the screen grid of the other tube so that each screen grid functions as a control grid for its respective tube.

BRIEF DESCRIPTION OF THE DRAWING

The drawing is a schematic representation depicting the essential circuitry of the amplifier of the present invention.

DESCRIPTION OF THE PREFERRED EMBODIMENT

Referring to the drawing, a pair of NPN transistors 10 and 12 are connected in a push-pull configuration to form a portion of the driver stage of the amplifier of the present invention. The transistor 10 has a base electrode 14, an emitter electrode 16 and a collector electrode 18, while the transistor 12 has a base electrode 20, an emitter electrode 22 and a collector electrode 24.

The base electrodes 14 and 20 of the transistors 10 and 12, respectively, are connected in circuits including input sources 26 and 28, respectively, and the positive terminal of a common source 30 of D.C. supply voltage functioning as a bias source for the transistors. It is understood that the input sources 18 and 20 are connected to earlier stages (not shown) of the amplifier which include a phase splitting network for producing the two input sources of alternating current in a 180° out-of-phase relationship from a single signal source, in a conventional manner.

The emitter electrodes 16 and 22 of the transistors 10 and 12, respectively, are connected to a common source 32 of negative D.C. supply voltage through load resistors 34 and 36, respectively, while the collector electrodes 18 and 24 are respectively connected to the positive terminals of sources 38 and 40 of D.C. supply voltage, it being understood that the negative terminals of the latter sources are grounded in a conventional manner.

The output stage of the amplifier of the present invention includes a pair of conventional pentode vacuum tubes 42 and 44 connected in a push-pull configuration. The vacuum tube 42 includes a cathode 46, a plate 48 and a screen grid 50 extending between the cathode and the plate. A control grid 52 extends between the screen grid 50 and the cathode 46, and a suppressor grid 54 extends between the screen grid 50 and the plate 48.

The vacuum tube 44 includes a cathode 56, a plate 58 and a screen grid 60 extending between the cathode and the plate. A control grid 62 extends between the screen grid 60 and the cathode 56, and a suppressor grid 64 extends between the screen grid 60 and the plate 58.

It is understood that each tube 42 and 44 is provided with a heater, or filament, voltage for their respective cathodes 46 and 56 in a conventional manner.

According to one of the main features of the present invention, the aforementioned driver stage is directly coupled to the output stage by connecting the emitters 16 and 22 of the transistors 10 and 12, respectively, to the screen grids 50 and 60 of the tubes 42 and 44, respectively, so that the screen grids 50 and 60 are thus adapted to function as control grids for their respective tubes 42 and 44 in a manner to be described in greater detail later.

Also, the control grids 52 and 62 of each tube 42 and 44, along with the suppressor grids 54 and 64, are shunted to their respective cathodes 46 and 56, via conductors 66 and 68, respectively.

The negative terminal of a common source 70 of D.C. supply voltage is connected to both of the cathodes 46 and 56 of the tubes 42 and 44, respectively, while the positive terminal of the voltage source 70 is connected to the center tap of the primary winding of an output transformer 72 which is connected to the plates 48 and 58 of the tubes to act as a load for the circuit. Two output terminals 74 and 76 are connected to the secondary of the transformer 72 for connecting the output stage of the amplifier to a load, such as a loudspeaker.

The advantages of the above circuit are numerous. For example, one of the chief causes of tube failure, i.e. a grid-to-cathode short, is eliminated by the arrangement of the present invention since the grids 50 and 60, which normally function as screen grids, are utilized as control grids and are, therefore, located a greater distance from the cathode than a normal control grid.

Another advantage is that the shunting of the control grids 52 and 62 and the suppressor grids 54 and 64 to their respective cathodes 46 and 56 enables a much higher voltage to be applied to the plates 48 and 58, respectively. Also, since the control grids 52 and 62 and the suppressor grids 54 and 64 are shunted to their respective cathodes 46 and 56 and since the latter are negative with respect to the plates 48 and 58, respectively, the control grids and suppressor grids are negative with respect to their respective plates. Therefore, secondary electrons emitted by the plates are repelled by the suppressor grids and control grids and returned to the plates, therefore, avoiding any reverse current effects between the plates and the screen grids.

A still further advantage of the amplifier of the present invention is that the driver stage of the amplifier, including the transistors 10 and 12, supplies a substantial amount of current to the screen grids 50 and 60 of the tubes 42 and 44, respectively, which current is necessary for a proper operation of the output stage since the screen grids are used as control grids for their respective tubes. Also, the use of the transistors 10 and 12 enables a constant voltage to be maintained between the screen grid 50 and the cathode 46 of the tube 42 and between the screen grid 60 and the cathode 56 of the tube 44.

A still further advantage of the amplifier of the present invention is that all electrode and grid impedances can be kept relatively low thus eliminating unwanted electron emissions and resultant thermal instabliities. Also, the idling currents can be kept relatively low which enables the tubes 42 and 44 to run cool, and relatively small bias voltages are required to turn off the tubes despite the relatively high plate voltages present.

The net result of all of the above features of the present invention is that the amplifier can be designed for linear operation resulting in very high efficiency and a relatively high power output at low distortion while maintaining the tubes 42 and 44 at a relatively low temperature.

The above advantages will be better highlighted with reference to some unique operating conditions utilizing the amplifier of the present invention. In particular, the design preferably is such that a current of at least 5 milliamps peak-to-peak and typically 40 milliamps peak-to-peak, may be applied to the screen grids 50 and 60, which is much higher than any known prior art designs. Also, each of the scren grids 50 and 60 have a relatively low imput impedance of 5000 ohms and each tube 42 and 44 has a quiescent plate current of as little as five milliamps. Further, the plate voltage of each tube may be approximately 2000 volts peak-to-peak and is at least 1500 volts peak-to-peak at cut off, i.e. when the plate current is zero. This relatively high plate voltage can be utilized to produce a power output of 100-150 watts RMS into an eight ohm load.

It is understood that although the above description relates to a single channel, or mono, system it is equally applicable to multi-channel design, such as in the case of a stereophonic reproduction system.

Of course, variations of the specific construction and arrangement of the apparatus disclosed above can be made by those skilled in the art without departing from the invention as defined in the appended claims.

I claim:

1. An audio amplifier comprising two transistors each having an emitter electrode, a collector electrode and a base electrode; circuit means for connecting said transistors in a push-pull configuration with their respective base electrodes respectively connected in series with two antiphased signal sources and a direct current bias voltage; two pentode vacuum tubes each having a cathode, a plate, a screen grid located between said cathode and said plate, a control grid located between said cathode and said screen grid and a suppressor grid located between said screen grid and said plate; conductor means for directly connecting the control grid and the suppressor grid of each tube to their respective cathodes; circuit means for connecting said tubes in a push-pull configuration; and circuit means for permitting direct current flow from the emitter electrode of one of said transistors to the screen grid of one of said tubes and the emitter electrode of the other transistor to the screen grid of the other tube, with each screen grid functioning as a control grid for its respective tube.

2. The amplifier of claim 1, wherein said last circuit means includes a resistor connected in series with a source of direct current between each screen and its respective cathode.

3. The amplifier of claim 1, wherein the cathode of each of said tubes is connected to the negative terminal of a supply voltage and the plate of each tube is connected to the positive terminal of said latter supply voltage, wherein the control grid and the screen grid of each tube are negative with respect to their respective plates.

4. The amplifier of claim 1, further comprising means including said transistors and said last circuit means for applying a current of at least five milliamps peak-to-peak to each of said screen grids.

* * * * *